(12) United States Patent
Kim et al.

(10) Patent No.: US 9,553,138 B2
(45) Date of Patent: Jan. 24, 2017

(54) ORGANIC LIGHT-EMITTING DIODE DISPLAY HAVING A REPAIR LINE

(71) Applicant: Samsung Display Co., Ltd., Yongin-si, Gyeonggi-do (KR)

(72) Inventors: Dae-Woo Kim, Cheonan-si (KR); Jong-Hyun Park, Cheongju-si (KR); Sun Park, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/923,281

(22) Filed: Oct. 26, 2015

(65) Prior Publication Data
US 2016/0233286 A1     Aug. 11, 2016

(30) Foreign Application Priority Data

Feb. 9, 2015 (KR) .................. 10-2015-0019676

(51) Int. Cl.
| | | |
|---|---|---|
| *H01L 27/15* | (2006.01) | |
| *H01L 31/12* | (2006.01) | |
| *H01L 33/00* | (2010.01) | |
| *H01L 27/32* | (2006.01) | |

(52) U.S. Cl.
CPC ....... *H01L 27/3276* (2013.01); *H01L 27/3223* (2013.01); *H01L 2251/568* (2013.01)

(58) Field of Classification Search
CPC .. H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

| | | | |
|---|---|---|---|
| 7,214,608 B2 | 5/2007 | Angyal et al. | |
| 2013/0048990 A1 | 2/2013 | Park et al. | |
| 2015/0294618 A1* | 10/2015 | Park ..................... | G09G 3/3291 345/214 |

FOREIGN PATENT DOCUMENTS

| | | |
|---|---|---|
| KR | 10-2004-0062139 A | 7/2004 |
| KR | 10-2007-0068193 A | 6/2007 |
| KR | 10-2007-0068194 A | 6/2007 |

* cited by examiner

*Primary Examiner* — Hoai V Pham
(74) *Attorney, Agent, or Firm* — Knobbe Martens Olson & Bear LLP

(57) ABSTRACT

An organic light-emitting diode display is disclosed. In one aspect, the OLED display includes a first connection line extending in a first direction and electrically connected to an OLED configured to emit light, a repair line extending in a second direction crossing the first direction, and an insulating layer formed between the first connection line and the repair line and configured to electrically insulate the first connection line from the repair line. The repair line includes a joining portion extending from the repair line in the first direction and at least partially overlapping a portion of the first connection line.

19 Claims, 8 Drawing Sheets

ORGANIC LIGHT-EMITTING DIODE DISPLAY HAVING A REPAIR LINE

CROSS-REFERENCE TO RELATED APPLICATION

This application claims priority to and the benefit of Korean Patent Application No. 10-2015-0019676 filed in the Korean Intellectual Property Office on Feb. 9, 2015, the entire contents of which are incorporated herein by reference.

BACKGROUND

Field

The described technology generally relates to an organic light-emitting diode display.

Description of the Related Technology

Types of flat panel displays include liquid crystal displays (LCDs), plasma display panels (PDPs), organic light-emitting diode (OLED) displays, field effect displays (FEDs), and electrophoretic displays.

An OLED display includes a pixel electrode, a common electrode, and an organic emission layer interposed therebetween. Electrons injected from one electrode and holes injected from the other electrode are combined in the organic emission layer to generate excitons, and the generated excitons release energy to emit light.

Since OLED displays are affected by manufacturing process variations which can lead to cutoffs, short-circuits, or the like in a pixel circuit, an overcurrent of greater than a normal driving current can flow to some pixels and cause pixel defects to present themselves as bright spots.

In addition, various kinds of pixel defects caused by contaminants entering from the environment can also occur. Pixel defects can be repaired by using dummy lines inside the OLED display.

SUMMARY OF CERTAIN INVENTIVE ASPECTS

One inventive aspect relates to an OLED display that can easily repair pixels having defects.

Another aspect is an OLED display that can prevent resistance from increasing by joining different wires while repairing pixels having defects.

Another aspect is an OLED display that includes: a first connection line extending in a first direction and connected to an OLED for emitting light; a repair line extending in a second direction crossing the first direction; and an insulating layer formed between the first connection line and the repair line and insulating the first connection line from the repair line. The repair line can be formed with a joining portion that protrudes in the first direction and partially overlaps some of the first connection line.

The joining portion can have a quadrangular shape.

More than half a width of the joining portion in the second direction can overlap the first connection line.

The joining portion and the repair line can be integrally formed.

The first connection line can be formed below the repair line.

The first connection line can be formed above the repair line.

The OLED display can further include: a plurality of light-emitting pixels including the OLED and a first pixel circuit connected to the first connection line and the OLED; and at least one dummy pixel separated from the light-emitting pixel and including a second pixel circuit.

The dummy pixel can further include a second connection line that is connected to the second pixel and is insulated from and crosses the repair line.

The repair line can be formed on the same layer as a gate electrode of a thin film transistor included in each of the first and second pixel circuits, and the first connection line can be formed on the same layer as source and drain electrodes of the thin film transistor.

The repair line can be formed on the same layer as source and drain electrodes of a thin film transistor included in each of the first and second pixel circuits, and the first connection line can be formed on the same layer as a gate electrode of the thin film transistor.

The light-emitting pixels can be formed in a display area for displaying an image, and the dummy pixels can be formed in a non-display area around the display area.

A thickness of the insulating layer where the first connection line and the repair line overlap can be smaller than that of the insulating layer where they do not overlap.

The insulating layer can include at least one layer.

Another aspect is an organic light-emitting diode (OLED) display comprising: a first connection line extending in a first direction and electrically connected to an OLED configured to emit light; a repair line extending in a second direction crossing the first direction; and an insulating layer formed between the first connection line and the repair line and configured to electrically insulate the first connection line from the repair line, wherein the repair line includes a joining portion extending from the repair line in the first direction and at least partially overlapping a portion of the first connection line.

In the above OLED display, the joining portion is quadrangular.

In the above OLED display, more than about half the width of the joining portion defined in the first direction overlaps the first connection line.

In the above OLED display, the joining portion and the repair line are integrally formed.

In the above OLED display, the first connection line is formed below the repair line.

In the above OLED display, the first connection line is formed above the repair line.

The above OLED display further comprises: a plurality of light-emitting pixel each including the OLED and a first pixel circuit electrically connected to the first connection line and the OLED; and a dummy pixel separated from the light-emitting pixels and including a second pixel circuit.

In the above OLED display, the dummy pixel further includes a second connection line electrically connected to the second pixel circuit, wherein the dummy pixel is insulated from and crosses the repair line.

In the above OLED display, each of the first and second pixel circuits includes a thin film transistor including gate, source and drain electrodes, wherein the repair line is formed on the same layer as the gate electrodes of the thin film transistors, and wherein the first connection line is formed on the same layer as source and drain electrodes of the thin film transistors.

In the above OLED display, each of the first and second pixel circuits includes a thin film transistor including gate, source and drain electrodes, wherein the repair line is formed on the same layer as the source and drain electrodes of the thin film transistors and wherein the first connection line is formed on the same layer as the gate electrodes of the thin film transistors.

The above OLED display further comprises: a display area including the light-emitting pixels each configured to display an image; and anon-display area including the dummy pixel and surrounding the display area.

In the above OLED display, a thickness of the insulating layer where the first connection line and the repair line overlap is less than that of the insulating layer where they do not overlap.

In the above OLED display, the insulating layer includes at least two sub-insulating layers.

Another aspect is an organic light-emitting diode (OLED) display comprising: an OLED configured to emit light; a first pixel circuit electrically connected to the OLED; a first connection line extending in a first direction and electrically connected to the OLED and the pixel circuit, wherein the first connection line includes a cutting region configured to be cut via a laser so as to electrically disconnect the OLED from the pixel circuit when there is a defect in the pixel circuit; a repair line extending in a second direction crossing the first direction; and an insulating layer formed between the first connection line and the repair line and configured to electrically insulate the first connection line from the repair line, wherein the thickness of a first portion of the insulating layer overlapping the repair line is less than the thickness of a second portion of the insulating layer not overlapping the repair line, and wherein the repair line includes a joining portion extending from the repair line in the first direction and at least partially overlapping a portion of the first connection line.

In the above OLED display, the OLED includes first and second ends opposing each other, wherein the repair line is formed below the OLED and closer to the first end than the second end.

In the above OLED display, the width of the joining portion defined in the first direction is greater than the length of the joining portion defined in the second direction.

In the above OLED display, more than about half the width of the joining portion defined in the first direction overlaps the first connection line.

The above OLED display further comprises: a light-emitting pixel including the OLED and the first pixel circuit; and a dummy pixel separated from the light-emitting pixel and including a second pixel circuit and a second connection line electrically connected to the second pixel circuit, wherein the dummy pixel is insulated from and crosses the repair line.

In the above OLED display, each of the first and second pixel circuits includes a thin film transistor including gate, source and drain electrodes, wherein the repair line is formed on the same layer as the gate electrodes of the thin film transistors, and wherein the first connection line is formed on the same layer as the source and drain electrodes of the thin film transistors.

In the above OLED display, each of the first and second pixel circuits includes a thin film transistor including gate, source and drain electrodes, wherein the repair line is formed on the same layer as the source and drain electrodes of the thin film transistors, and wherein the first connection line is formed on the same layer as the gate electrodes of the thin film transistors.

According to at least one of the disclosed embodiments, the pixels having defects can be easily repaired.

In addition, since the different wires are melted and joined to repair the pixel where the defect occurs, the resistance can be prevented from increasing.

DETAILED DESCRIPTION OF CERTAIN INVENTIVE EMBODIMENTS

Figure 1:
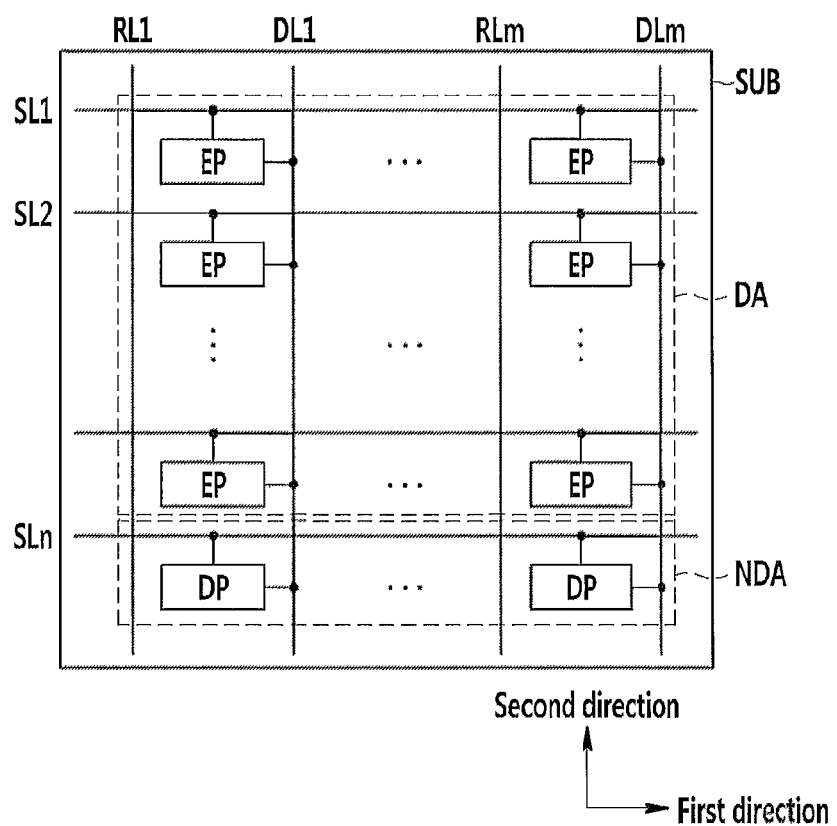
FIG. 1 is a schematic drawing of an OLED display according to an exemplary embodiment.

The described technology will be described more fully hereinafter with reference to the accompanying drawings, in which exemplary embodiments are shown.

As those skilled in the art would realize, the described embodiments can be modified in various different ways, all without departing from the spirit or scope of the described technology.

On the contrary, exemplary embodiments introduced herein are provided to make disclosed contents thorough and complete and to sufficiently transfer the spirit to those skilled in the art.

In the drawings, the thickness of layers and regions can be exaggerated for clarity.

In addition, when a layer is described to be formed "on" another layer or substrate, this means that the layer can be formed directly on the other layer or substrate, or a third layer can be interposed between the layer and the other layer or the substrate.

Like reference numerals designate like elements throughout the specification. In this disclosure, the term "substantially" includes the meanings of completely, almost completely or to any significant degree under some applications and in accordance with those skilled in the art. The term "connected" can include an electrical connection.

An OLED display according to an exemplary embodiment will now be described with reference to FIGS. 1 to 4.

Figure 2:
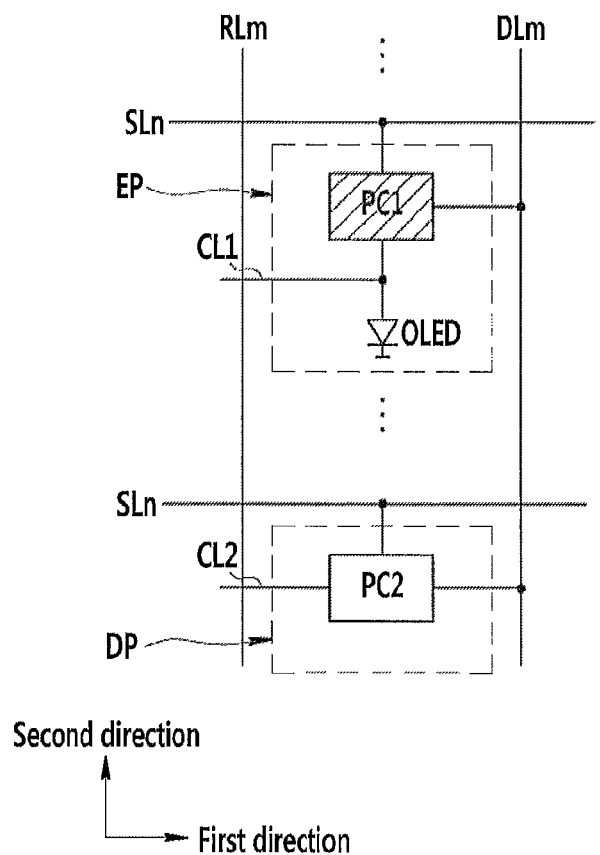
FIG. 2 is an illustration of a connection structure of a light-emitting pixel and a dummy pixel.
Figure 3:
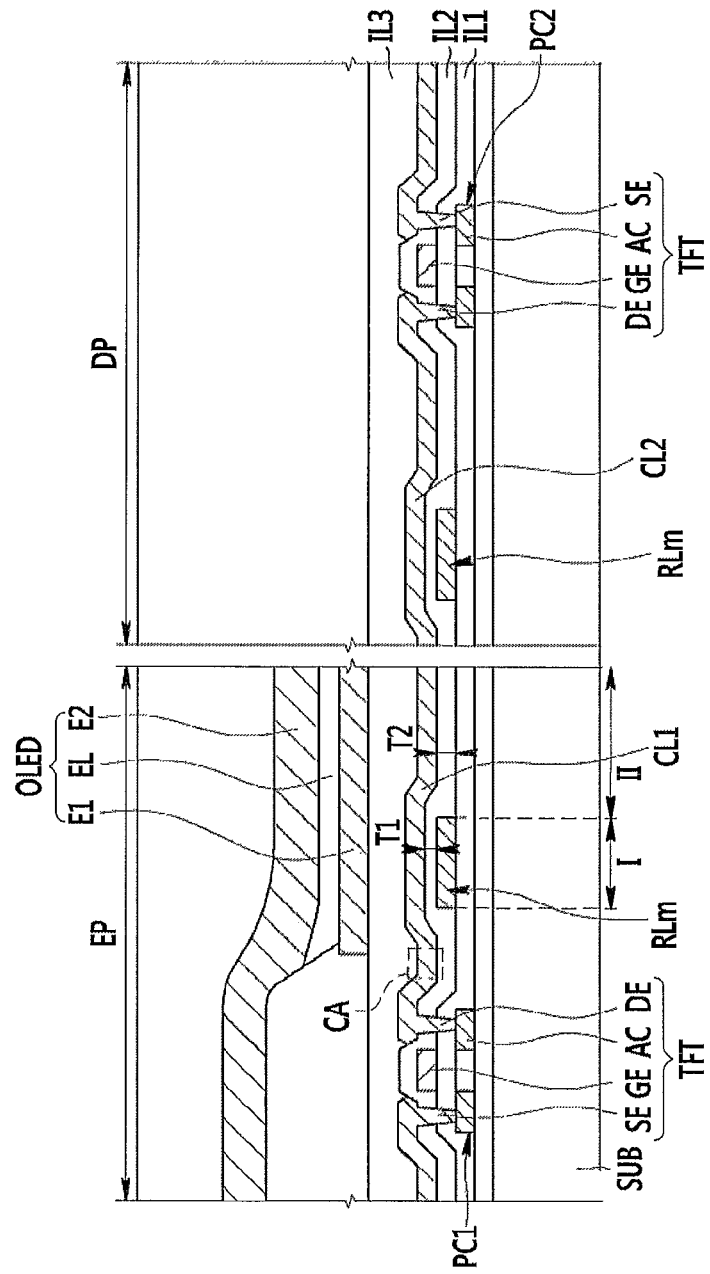
FIG. 3 is a cross-sectional view of the light-emitting pixel and the dummy pixel of the OLED display of FIG. 1 that are not repaired.
Figure 4:
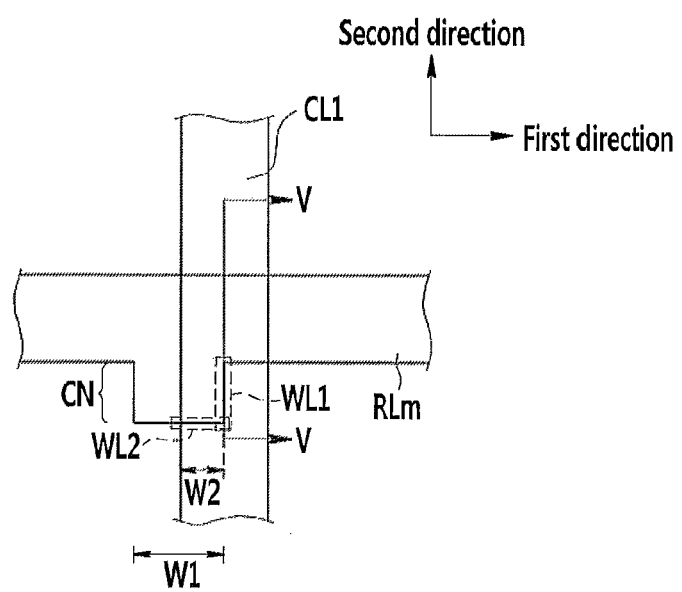
FIG. 4 is a top plan view of a first connection line and a repair line of the OLED display of FIG. 1 according to the exemplary embodiment.

FIG. 1 is a schematic drawing of an OLED display according to an exemplary embodiment. FIG. 2 is an illustration of a connection structure of a light-emitting pixel and a dummy pixel. FIG. 3 is a cross-sectional view of the light-emitting pixel and the dummy pixel of the OLED display that are not repaired. FIG. 4 is a top plan view of a first connection line and a repair line of the OLED display according to the exemplary embodiment.

Referring to FIG. 1, the OLED display includes a substrate SUB, a plurality of scan lines SL1 to SLn, a plurality of data lines DL1 to DLm, a plurality of repair lines RL1 to RLm, a plurality of light-emitting pixels EP, and a plurality of dummy pixels DP.

In this case, the pixel represents the smallest unit for displaying an image.

In FIG. 1, only the substrate SUB, the scan line SLn, the data line DLm, the repair line RLm, the light-emitting pixel EP, and the dummy pixel DP are illustrated, but the described technology is not limited thereto. The OLED display according to the exemplary embodiment can further include signal lines such as a driving power line, an initialization power line, etc.

The substrate SUB can be an insulating substrate formed of a polyimide, a polyamide, a polyacrylate, glass, or stainless steel.

The substrate SUB includes a display area DA for displaying an image, and a non-display area NDA neighboring the display area DA.

The light-emitting pixels EP are formed in the display area DA of the substrate SUB, while the dummy pixels DP are formed in the non-display area NDA of the substrate SUB.

The scan lines SL1 to SLn can extend in a first direction, e.g., a row direction, and can be arranged to be separated from each other in a second direction crossing the first direction, e.g., a column direction, respectively.

However, the directions of the scan lines SL1 to SLn are not limited thereto, and they can be formed in various directions.

In this case, the scan lines SL1 to SLn can be connected to thin film transistors of each of the light-emitting pixels EP and the dummy pixels DP, and the OLEDs of the light-emitting pixels EP can emit light according to signals of the scan lines SL1 to SLn.

In some embodiments, the single scan line SLn is connected to each of the light-emitting pixels EP and each of the dummy pixels DP, but the described technology is not limited thereto. The scan lines SL1 to SLn can be connected to each of the light-emitting pixels EP and each of the dummy pixels DP.

Meanwhile, the data lines DL1 to DLm can extend in the second direction and can be arranged to be separated from each other in the first direction.

Like the scan lines SL1 to SLn, the directions of the data lines DL1 to DLm are not limited thereto, and they can be can be formed in various directions.

The data lines DL1 to DLm are insulated from and cross the scan lines SL1 to SLn, respectively.

The data lines DL1 to DLm can be connected to the thin film transistors of each of the light-emitting pixels EP and the dummy pixels DP, and the OLEDs of the light-emitting pixels EP can emit light according to signals of the data lines D1 to DLm.

In some embodiments, the single data line DLm is connected to each of the light-emitting pixels EP and each of the dummy pixels DP, but the described technology is not limited thereto. The data lines DL1 to DLm can be connected to each of the light-emitting pixels EP and each of the dummy pixels DP.

In this case, the data lines DL1 to DLm can include the data lines, the driving power line, etc.

In some embodiments, the repair lines RL1 to RLm can extend in the second direction and can be arranged to be separated from each other in the first direction.

The directions of the repair lines RL1 to RLm are not limited thereto, and they can be formed in various directions.

The repair lines RL1 to RLm are insulated from and cross the scan lines SL1 to SLn, respectively.

The repair lines RL1 to RLm are adjacent to the light-emitting pixels EP and the dummy pixels DP.

In this case, when a defect occurs in one of the light-emitting pixels EP neighboring the single repair line RLm, the defective light-emitting pixel EP can be connected to the repair line RLm.

The repair line RLm connected to the defective light-emitting pixel EP can be connected to the dummy pixel DP.

Connections between the specific defective light-emitting pixel EP and the repair line RLm and between the repair line RLm and the dummy pixel DP will be described later.

The repair lines RL1 to RLm can be formed on the same layer as the scan line SLn or the same layer as the data line DLm, or can be formed on a different layer from each of the scan lines SL1 to SLn and each of the data lines DL1 to DLm.

The light-emitting pixels EP are formed in the display area DA of the substrate SUB to display an image.

The light-emitting pixel EP includes a first pixel circuit that includes a plurality of thin film transistors and at least one capacitor, and the OLED connected to the first pixel circuit.

The light-emitting pixels EP are connected to the scan line SLn and the data line DLm, and can emit light according to the signals transmitted via the scan line SLn and the data line DLm, respectively.

The dummy pixels DP are separated from the light-emitting pixels EP, and are formed in the non-display area NDA of the substrate SUB.

The dummy pixel DP includes a second pixel circuit that includes a plurality of thin film transistors and at least one capacitor.

The dummy pixels DP are connected to the scan line SLn and the data line DLm, respectively, and the same signal that is transmitted to the light-emitting pixel EP can be transmitted to each of the scan lines SL1 to SLn and each of the data lines DL1 to DLm.

Referring to FIGS. 2 and 3, the light-emitting pixel EP includes the first pixel circuit PC1, the OLED connected to the first pixel circuit PC1, and a first connection line CL1 connected to the OLED and insulated from and crossing the repair line RLm.

The first connection line CL1 can be integrally formed with a source electrode SE and a drain electrode DE of the thin film transistor TFT.

However, the first connection line CL1 is not limited thereto, and can be formed on a different layer from the source and drain electrodes SE and DE.

The repair line RLm is formed below the first connection line CL1.

As described above, the repair line RLm is formed below the first connection line CL1, and is insulated from and crosses the first connection line CL1.

When a defect occurs in the light-emitting pixel EP, the repair line RLm can be connected to the first connection line CL1.

A detailed description thereof will be described in a repair method to be described later.

The repair line RLm is formed on the same layer as a gate electrode GE of the thin film transistor TFT included in each of the first and second pixel circuits PC1 and PC2, but it is not limited thereto, and it can be formed on a different layer from the gate electrode GE.

The dummy pixel DP includes the second pixel circuit PC2, and a second connection line CL2 that is connected to the second pixel circuit PC2 to be separated from and cross the repair line RLm.

The second connection line CL2 is integrally formed with the source and drain electrodes SE and DE of the thin film transistor TFT, but it is not limited thereto. The second connection line CL2 can be formed on a different layer from the source and drain electrodes SE and DE.

The aforementioned repair line RLm is formed below the second connection line CL2.

When the defect occurs in the light-emitting pixel EP, the repair line RLm can be connected to the second connection line CL2.

A detailed description thereof will be described in a repair method to be described later.

The first pixel circuit PC1 of the light-emitting pixel EP and the second pixel circuit PC2 of the dummy pixel DP include a plurality of thin film transistors TFT including an active layer AC, the gate electrode GE, the source electrode SE, the drain electrode DE, and at least one capacitor, respectively.

A first insulating layer IL1 is formed between the gate electrode GE and the active layer AC, a second insulating layer IL2 is formed between the gate electrode GE and the source electrode SE, and the source and drain electrodes SE and DE are covered by a third insulating layer IL3.

The first, second, and third insulating layers IL1, IL2, and IL3 can be formed as a single layer or multiple layers respectively formed of an organic or inorganic material.

The OLED includes a first electrode E1 connected to the thin film transistor TFT, an organic emission layer EL formed on the first electrode E1, and a second electrode E2 formed on the first electrode E1 to interpose the organic emission layer EL therebetween.

At least one of the first and second electrodes E1 and E2 is formed as a light transmissive electrode, and light emitted from the organic emission layer EL can be emitted toward at least one of the first and second electrodes E1 and E2.

That is, the OLED display can be formed as a top emission type or a bottom emission type.

In some embodiments, as shown in FIG. 3, the second insulating layer IL2 formed between the first connection line CL1 and the repair line RLm has a thickness that varies according to a position.

More specifically, the second insulating layer IL2 can be divided into a region I where the first connection line CL1 and the repair line RLm overlap, and a region II where the first connection line CL1 and the repair line RLm do not overlap.

In the second insulating layer IL2, a thickness T1 of the region I is less than a thickness T2 of the region II.

Since the thickness T1 is less than the thickness T2, the first connection line CL1 and the repair line RLm can be easily joined in a repair process using a laser.

That is, the thickness of the second insulating layer IL2 between the first connection line CL1 and the repair line RLm is less than the other portions, so that the first connection line CL1 and the repair line RLm can be easily joined.

In addition, the second insulating layer IL2 formed between the second connection line CL2 and the repair line RLm can have, as described above, a thickness that varies according to the position.

That is, a thickness of the second insulating layer IL2 where the second connection line CL2 and the repair line RLm overlap can be formed less than that of the second insulating layer IL2 where the second connection line CL2 and the repair line RLm do not overlap.

In this case, the second insulating layer IL2 of different thicknesses can be formed using a half-tone mask.

Figure 5:
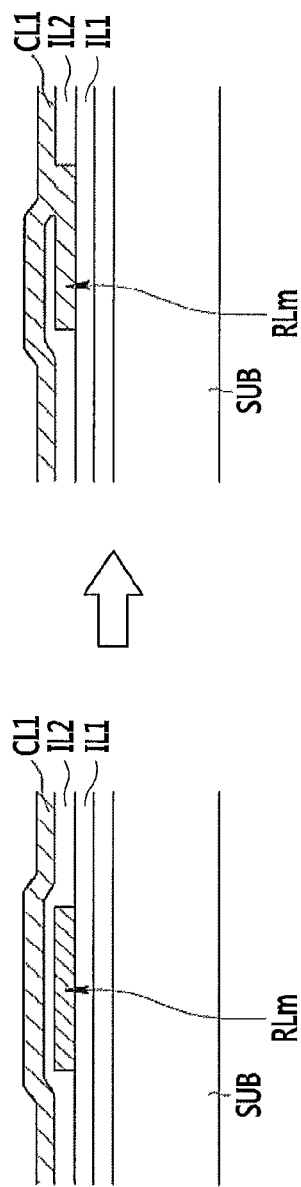
FIG. 5 is a cross-sectional view of FIG. 4 taken along the line V-V.

Referring to FIGS. 4 and 5, a joining portion CN is formed in the repair line RLm to protrude in the first direction.

The joining portion CN is one region of the repair line RLm that is joined with the first connection line CL1 during repair work.

The joining portion CN can have a quadrangular shape.

However, the shape of the joining portion CN is not limited thereto, and it can have a shape such as substantially semi-circular, substantially circular, substantially triangular, and substantially pentagonal shapes.

In some embodiments, the joining portion CN partially overlaps a portion of the first connection line CL1.

As will be described later in FIG. 6, a partial width of the first connection line CL1 in the second direction overlaps the portion of the joining portion CN.

For example, more than half a width W1 of the joining portion CN overlaps the first connection line CL1.

That is, a width W2 by which the joining portion CN and the first connection line CL1 overlap can be greater than half the width W1 of the joining portion CN.

In the repair process, a laser is irradiated at a rear side of the repair line RLm below the first connection line CL1 such that the repair line RLm and the first connection line CL1 are melted and joined to each other.

Figure 6:
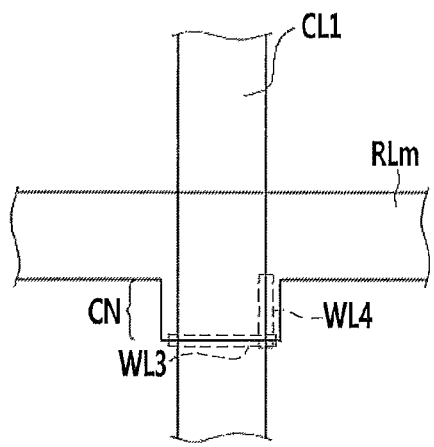
FIG. 6 is a drawing for illustrating a state of the first connection line being covered by a joining portion.

Since the width of the first connection line CL1 is generally less than that of the joining portion CN of the repair line RLm, as shown in FIG. 6, if the first connection line CL1 does not partially overlap some of the joining portion CN, the first connection line CL1 is not seen in a plan view because it is covered by the repair line RLm.

That is, when the entire first connection line CL1 overlaps some of the repair line RLm, the first connection line CL1 is covered by the repair line RLm.

In FIG. 6, when the laser is irradiated along a fourth joining line WL4, the first connection line CL1 and the repair line RLm can be safely joined.

However, since the first connection line CL1 is covered by the repair line RLm at the rear side of the repair line RLm, they cannot be joined along the fourth joining line WL4.

In addition, in FIG. 6, when the laser is irradiated along a third joining line WL3, there is a risk of the first connection line CL1 being cut off by the laser.

Therefore, in some embodiments, when the joining portion CN of the repair line RLm partially overlaps some of the first connection line CL1, as shown in FIG. 4, the laser is irradiated along a first joining line WL1.

In addition, the laser can be irradiated along a second joining line WL2.

However, resistance when joined along the second joining line WL2 can increase compared to that when joined along the first joining line WL1, because a width of the joined portion is small.

According to at least one of the disclosed embodiments, when joined along the first joining line WL1, the first connection line CL1 and the repair line RLm can be joined while minimizing an increase in resistance.

Meanwhile, as a length of the protruding portion of the joining portion CN becomes greater, a length of the first joining line WL1 increases.

Accordingly, the resistance of the joined portion can decrease.

That is, as the length of the joining portion CN in the first direction becomes longer, the resistance of the joined portion can decrease.

A process of repairing the defect when a defect occurs in a light-emitting pixel EP will now be described with reference to FIGS. 7 and 8.

Figure 7:
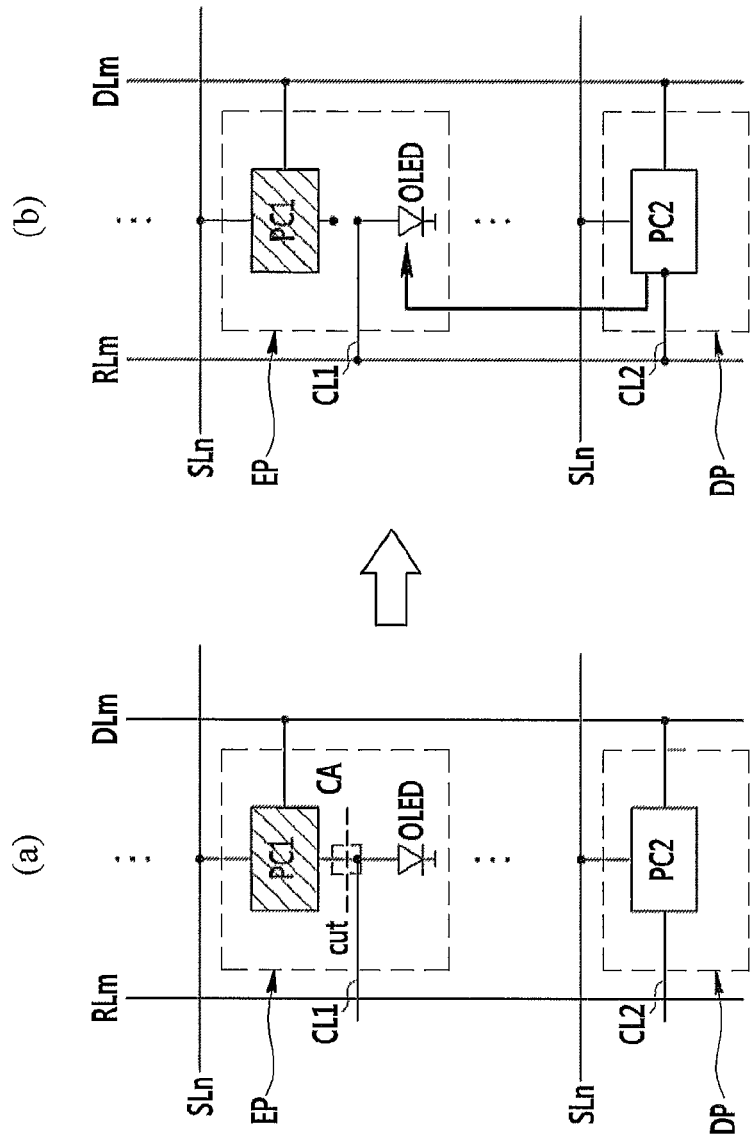
FIG. 7 is a drawing for illustrating a repair method of an OLED display according to an exemplary embodiment.

FIG. 7 is a drawing for illustrating a repair method of an OLED display according to an exemplary embodiment. FIG. 8 is a drawing for illustrating a light-emitting pixel and a dummy pixel of the OLED display that are repaired.

Figure 8:
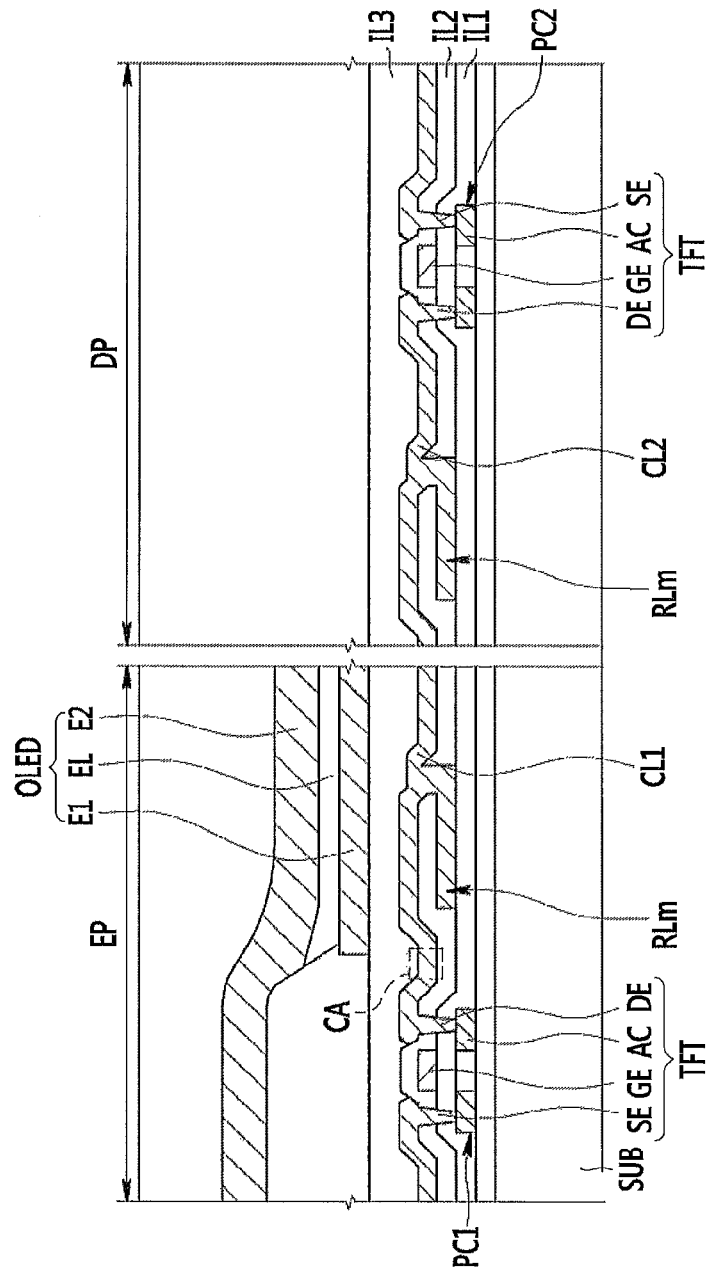
FIG. 8 is a drawing for illustrating a light-emitting pixel and a dummy pixel of the OLED display that are repaired.

Referring to FIGS. 7 and 8, when a first pixel circuit PC1 of one of a plurality of light-emitting pixels EP has a defect, a cutting region CA between the first pixel circuit PC1 and an OLED is cut.

Such cutting can be performed using a laser beam.

For example, a conductive pattern between a drain electrode DE of a thin film transistor TFT and a first electrode E1 of the OLED is cut to separate the first pixel circuit PC1 and the OLED using the laser beam.

That is, the OLED is cut off from the first pixel circuit PC1, and the cut-off operation can be performed by the laser.

Next, as shown in FIG. 7 (*b*) and FIG. 8, a first connection line CL1 of a light-emitting pixel EP and a joining portion CN of a repair line RLm are directly connected to connect the repair line RLm and the OLED of the light-emitting pixel EP, and a second connection line CL2 of a dummy pixel DP and the repair line RLm are directly connected to connect the repair line RLm connected with the OLED and the second pixel circuit PC2 of the dummy pixel DP.

Thus, the OLED of one of the light-emitting pixels EP is connected to the second pixel circuit PC2 of the dummy pixel DP through the repair line RLm connected to the first connection line CL1.

In addition, the OLED connected to the second pixel circuit PC2 of the dummy pixel DP is cut off from the first pixel circuit PCI of the light-emitting pixel EP.

As described above, a repair operation can be performed to allow the OLED of the light-emitting pixel EP to emit light using the second pixel circuit PC2 of the dummy pixel DP by cutting off the first pixel circuit PC1 of the defective light-emitting pixel EP from the OLED and then connecting the OLED of the light-emitting pixel EP to the second pixel circuit PC2 of the dummy pixel DP using the repair line RLm.

Meanwhile, the repair operation can be performed before or after forming the organic emission layer EL.

According to at least one of the disclosed embodiments, the arrangement of the joining portion CN of the repair line RLm and the first connection line CL1 can prevent the first connection line CL1 from being cut off by the laser in the repair process, and the increase in resistance at the joined portion can be prevented.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
   a first connection line extending in a first direction and electrically connected to an OLED configured to emit light;
   a repair line extending in a second direction crossing the first direction; and
   an insulating layer formed between the first connection line and the repair line and configured to electrically insulate the first connection line from the repair line,
   wherein the repair line includes a joining portion extending from the repair line in the first direction and at least partially overlapping a portion of the first connection line.

2. The OLED display of claim 1, wherein the joining portion is quadrangular.

3. The OLED display of claim 1, wherein more than about half the width of the joining portion defined in the first direction overlaps the first connection line.

4. The OLED display of claim 1, wherein the joining portion and the repair line are integrally formed.

5. The OLED display of claim 1, wherein the first connection line is formed below the repair line.

6. The OLED display of claim 1, wherein the first connection line is formed above the repair line.

7. The OLED display of claim 1, further comprising:
   a plurality of light-emitting pixel each including the OLED and a first pixel circuit electrically connected to the first connection line and the OLED; and
   a dummy pixel separated from the light-emitting pixels and including a second pixel circuit.

8. The OLED display of claim 7, wherein the dummy pixel further includes a second connection line electrically connected to the second pixel circuit, and wherein the dummy pixel is insulated from and crosses the repair line.

9. The OLED display of claim 7, wherein each of the first and second pixel circuits includes a thin film transistor including gate, source and drain electrodes,
   wherein the repair line is formed on the same layer as the gate electrodes of the thin film transistors, and
   wherein the first connection line is formed on the same layer as source and drain electrodes of the thin film transistors.

10. The OLED display of claim 7, wherein each of the first and second pixel circuits includes a thin film transistor including gate, source and drain electrodes,
    wherein the repair line is formed on the same layer as the source and drain electrodes of the thin film transistors and
    wherein the first connection line is formed on the same layer as the gate electrodes of the thin film transistors.

11. The OLED display of claim 7, further comprising:
    a display area including the light-emitting pixels each configured to display an image; and
    a non-display area including the dummy pixel and surrounding the display area.

12. The OLED display of claim 1, wherein a thickness of the insulating layer where the first connection line and the repair line overlap is less than that of the insulating layer where they do not overlap.

13. The OLED display of claim 1, wherein the insulating layer includes at least two sub-insulating layers.

14. An organic light-emitting diode (OLED) display comprising:
    an OLED configured to emit light;
    a first pixel circuit electrically connected to the OLED;
    a first connection line extending in a first direction and electrically connected to the OLED and the pixel circuit, wherein the first connection line includes a cutting region configured to be cut via a laser so as to electrically disconnect the OLED from the pixel circuit when there is a defect in the pixel circuit;
    a repair line extending in a second direction crossing the first direction; and
    an insulating layer formed between the first connection line and the repair line and configured to electrically insulate the first connection line from the repair line,
    wherein the thickness of a first portion of the insulating layer overlapping the repair line is less than the thickness of a second portion of the insulating layer not overlapping the repair line, and wherein the repair line includes a joining portion extending from the repair line in the first direction and at least partially overlapping a portion of the first connection line.

15. The OLED display of claim 14, wherein the width of the joining portion defined in the first direction is greater than the length of the joining portion defined in the second direction.

16. The OLED display of claim 14, wherein more than about half the width of the joining portion defined in the first direction overlaps the first connection line.

17. The OLED display of claim 14, further comprising:
a light-emitting pixel including the OLED and the first pixel circuit; and
a dummy pixel separated from the light-emitting pixel and including a second pixel circuit and a second connection line electrically connected to the second pixel circuit, wherein the dummy pixel is insulated from and crosses the repair line.

18. The OLED display of claim 17, wherein each of the first and second pixel circuits includes a thin film transistor including gate, source and drain electrodes,
wherein the repair line is formed on the same layer as the gate electrodes of the thin film transistors, and
wherein the first connection line is formed on the same layer as the source and drain electrodes of the thin film transistors.

19. The OLED display of claim 17, wherein each of the first and second pixel circuits includes a thin film transistor including gate, source and drain electrodes,
wherein the repair line is formed on the same layer as the source and drain electrodes of the thin film transistors, and
wherein the first connection line is formed on the same layer as the gate electrodes of the thin film transistors.

* * * * *